United States Patent [19]
Riemenschneider et al.

[11] 3,972,031
[45] July 27, 1976

[54] VARIABLE LENGTH SHIFT REGISTER ALTERNATELY OPERABLE TO STORE AND RECIRCULATE DATA AND ADDRESSING CIRCUIT THEREFOR

[75] Inventors: Don H. Riemenschneider; William L. Townsend; Joseph W. Pehoushek, all of Cincinnati, Ohio

[73] Assignee: Zonic Technical Laboratories, Inc., Cincinnati, Ohio

[22] Filed: Aug. 15, 1974

[21] Appl. No.: 497,757

[52] U.S. Cl. .................... 340/173 R; 340/173 RC
[51] Int. Cl.² ...................................... G11C 13/00
[58] Field of Search .................. 340/173 RC, 173 R

[56] References Cited
UNITED STATES PATENTS

| | | | |
|---|---|---|---|
| 3,275,993 | 9/1966 | Bartlett | 340/173 RC |
| 3,523,284 | 8/1970 | Washizuka | 340/173 RC |
| 3,763,480 | 10/1973 | Weimer | 340/5 M |
| 3,772,658 | 11/1973 | Sarlo | 340/5 M |

*Primary Examiner*—Terrell W. Fears
*Attorney, Agent, or Firm*—Wood, Herron & Evans

[57] ABSTRACT

A system for storing and thereafter cyclicly reproducing transient information including $nm$-element shift registers, either digital or analog, connected in cascade and operable in either (a) a data entry mode for storing transient data therein or (b) a recirculating mode for cyclicly reproducing at the output thereof the information stored therein. A clock of selectively variable frequency is provided for sampling transient information and/or shifting data through the shift register cascade depending upon whether the shift register cascade is in its data storage or its recirculation mode. An addressing circuit responsive to the clock signals for keeping track of the changing address of the stored information currently output from the shift register cascade is provided, and includes a single $nm$-bit counter in the form of a "divide-by-$n$" circuit and an "$m$-counter" circuit connected in series. The output of the $m$-counter at any given time is correlated to the address of the stored information currently output from the shift register cascade. The address, in combination with the information presented at the output of the shift register cascade, are input to a recording device, such as an oscilloscope, where they control the horizontal and vertical deflection plates to provide a continuous plot with respect to time, of the information recirculating in the shift register cascade. A trigger circuit is provided to reset the divide-by-$n$ and $m$-counter circuits when it is desired to record new transient information to thereby insure that the addresses of the newly stored transient data will be referenced to the new trigger signal. By altering the divide-by-$n$ circuit such that $n$ always corresponds to the number of $m$-element registers connected in cascade, proper addresses are provided for information stored and/or recirculating in the shift register cascade regardless of the number of $m$-element registers actually connected to form the cascade.

15 Claims, 1 Drawing Figure

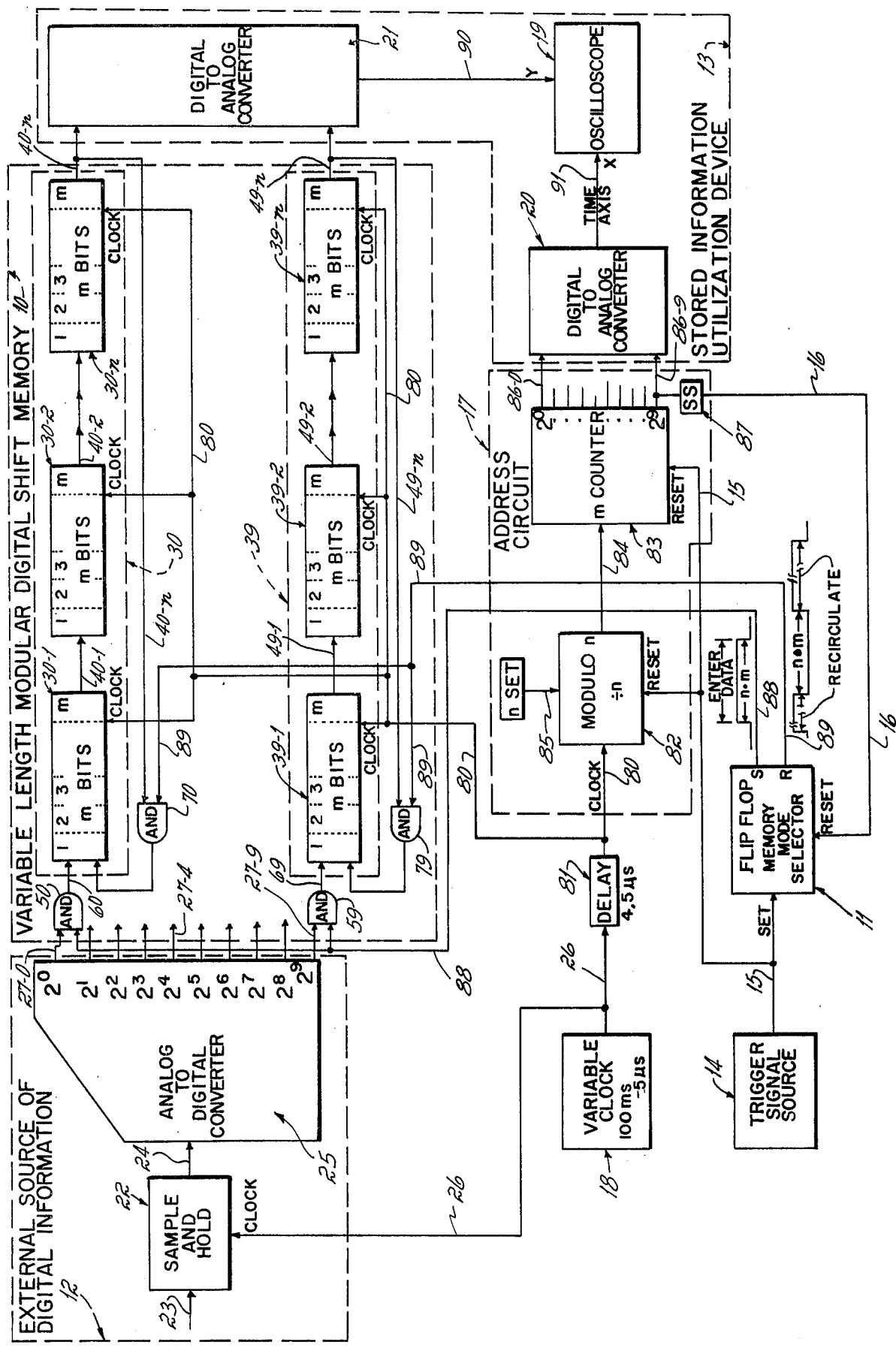

VARIABLE LENGTH SHIFT REGISTER ALTERNATELY OPERABLE TO STORE AND RECIRCULATE DATA AND ADDRESSING CIRCUIT THEREFOR

This invention relates to a shift register for storing and reproducing information, and more particularly to data storage and reproduction shift registers of selectively variable length and simplified addressing circuits therefor.

Shift registers have been used for some time to record information, such as a transient signal, and thereafter continuously recirculate the stored information such that it can be repetitively reproduced at the output of the shift register for display purposes or the like. A shift register is nothing more than a plurality of individual storage elements connected in a series or chain such that data entered at the input thereof propogates, or shifts, from one storage element in the chain to the next. The entry of data at the input to the chain can either be from an external source of data, such as a pressure transducer, or alternatively can be stored data leaving the output of the chain. In the former case, the shift register is considered to be operating in a "storage" mode, whereas in the latter case the shift register operates in what is termed a "recirculating" mode.

By initially placing a shift register in its storage mode it is possible to enter and store transient information. Once the transient information is stored, the shift register can then be placed in its recirculate mode and the transient information stored therein cyclicly presented at the output of the shift register for continuously reproducing the transient data, such as in the form of an X-Y plot on the screen of an oscilloscope.

When shift registers are utilized for storage, cyclic reproduction and display of transient information, it is necessary to know the "address", i.e., the relationship, with respect to the beginning of the transient information, of each sample of the stored information as it is presented at the output of the shift register in the course of recirculating therein. When the address and the recirculating information are input to an X-Y display, such as an oscilloscope, to produce an X-Y plot of the stored data, the address information controls the horizontal deflection plates which establish the X, or time, axis of the display and the recirculating transient information controls the vertical deflection plates which establish the Y axis of the display.

Illustrative transient information storage, reproduction and display systems of the general type described above, and with respect to which this invention relates, are proposed in U.S. Pat. No. 3,810,126 issued May 7, 1974; U.S. Pat. No. 3,816,815 issued June 11, 1974; and U.S. Pat. No. 3,662,380 issued May 9, 1972.

One of the problems with transient recording and display systems of the type proposed in the foregoing patents is that the length, or storage capacity, of the recirculating shift register cannot be conveniently varied as is sometimes desirable when the transients to be recorded and displayed by the system vary over a wide range. For example, and assuming the same degree of resolution is desired, transients of long duration require shift registers of greater length, whereas transients of short duration require shift registers of lesser length. It is possible to accommodate recording and display of both long duration and short duration transients with a single system having a shift register sufficient in length to accommodate the longest duration transient contemplated for use with the system. However, this is relatively inefficient and unnecessarily costly approach, particularly for users who only contemplate recording and displaying transients of relatively short duration, since the shift register capacity exceeding that required to record short duration transients is unnecessary and wasted.

Accordingly, it has been an objective of this invention to provide a transient recording reproduction system of selectively variable length memory capacity, and to provide such a system with a minimum of circuit complexity. This objective has been accomplished in accordance with certain principles of this invention by the unique combination of (a) $nm$-element shift register modules which, when one or more are connected in cascade, can be used to build up a single shift register cascade having an effective storage capacity of anywhere between $m$ elements and $nm$ elements in multiples of $m$ elements, and (b) an addressing circuit employing a resettable $nm$-bit counter having a capacity selectively variable in $m$-count increments, which in a preferred form includes a divide-by-$n$ circuit and an $m$-counter, with both being reset to zero at the beginning of each transient-storing operation and with the divide-by-$n$ circuit being adjustable to provide an output to the $m$-counter each time the divide-by-$n$ circuit is input with clock pulses corresponding in number to the number of $m$-element shift registers connected in cascade to form the variable length memory, the $m$-counter in turn accumulating a count correlated to the address. By merely adjusting the divide-by-$n$ circuit to correspond to the number of $m$-element shift register modules in the variable length memory, the count output from the $m$-counter at any instant will be correlated to the address of the recirculating information then present at the output of the shift register cascade regardless of the number of $m$-element shift registers used and, hence, the length of the memory. Thus, a variable length transient recording and recirculating shift register memory is provided having an extremely simplified circuit capable of correctly providing the address of information recirculating in the memory regardless of memory capacity.

Another problem present in transient recording and reproduction systems of the type proposed heretofore is that the shift register utilized is of the "dynamic" type which requires that the data in the memory be shifted at some predetermined minimum rate or faster, otherwise the stored data will be lost due to leakage effects inherent in capacitive storage elements typical of dynamic memories. With such dynamic memory systems, if it is desired to sample and store transient information at a rate less than the minimum required memory shifting rate, auxilliary circuitry must be utilized to interleave the transient data which is being sampled at a relatively low rate, in a memory which is being shifted at a relatively high rate. Such auxilliary "interleaving" circuitry necessary to accommodate low frequency data sampling and high frequency memory shifting, in practice, is relatively complex.

Accordingly, it has been a further objective of this invention to provide a transient storage and reproduction system which, with relatively simplified circuitry, can sample and store transient information in a shift register at low, near zero, sampling frequencies. This objective has been accomplished in accordance with certain further principles of the invention by utilizing, in the system of this invention previously described, shift registers of the "static" type which can be shifted at any desired rate without loss of information. With a memory incorporating static shift registers, the shifting rate of the memory can be matched so that of the transient sampling rate, both of which can approach zero Hertz, without loss of stored information. Thus, transient sampling rates in the near zero Hertz range can be utilized without need for sophisticated circuitry to interleave low frequency samples in a memory shifted at high frequency typical of the dynamic storage transient sampling and reproduction proposals of the prior art.

These and other objectives and advantages of the invention will be more readily apparent from a detailed description thereof taken in conjunction with the single FIGURE which is a schematic circuit, in block diagram format, of a preferred embodiment of the invention.

With reference to the FIGURE, the preferred embodiment is seen to include a variable length modular digital shift memory 10 which is under the control of a memory mode selector circuit 11 such that the memory either (a) stores digital information input thereto from an external source of digital information 12, or (b) recirculates previously stored information which is made available on a cyclic basis to a stored information utilization device 13 which may include an oscilloscope or the like. The memory mode selector 11 is responsive to a source of trigger signals 14 such that, upon the occurrence of each trigger signal on line 15, the memory 10 is placed in its storage mode to store therein the digital information available at the output of the digital information source 12. The memory mode selector 11 is also responsive to an output on line 16 from an address circuit 17 produced when, after the occurrence of a trigger signal on line 15, the entire memory 10 has been filled with information from the data source 12, for switching the memory mode from the storage mode to the recirculate mode such that the information from the source 12 just stored in the memory will be recirculated until the next trigger signal is produced to effect storage in the memory of new digital information. The address circuit 17, in addition to causing the memory mode selector 11 to switch the memory 10 to its recirculate mode when it has been filled with data, also functions to keep track of the address of the recirculating data output from the memory to the utilization device 13, the address being in digital form with reference to the trigger signal which preceded storage of the data in the memory. Finally, the variable frequency clock 18 is provided for synchronously (a) transferring data from the external source 12 to the memory 10, (b) shifting information within the memory 10 from the input to the output thereof, and (c) stepping the address circuit 17.

In operation, and assuming that the memory 10 is in its recirculation mode under control of the memory mode selector 11, the digital information in the memory 10 is recirculating at a rate established by the frequency of the clock 18. Additionally, the address circuit 17, also responsive to the clock 18 and the trigger source 14, is providing an input to the stored information utilization device 13 correlated to the changing address of the recirculating information output from the memory circuit 10. If the recorded information utilization device 13 is, for example, an oscilloscope display 19 the continuously changing address output from the circuit 17 is input via a digital-to-analog converter 20 to the horizontal deflection plates of the oscilloscope which control the time, or X, axis of the display while the output from the memory 10 is input via a digital-to-analog converter 21 to the vertical deflection plates of the display which control the Y axis correlated to the magnitude of the stored information output from the memory. With these inputs to the oscilloscope 19, the oscilloscope provides a display of the data recirculating in the memory 10.

Upon receipt of a trigger signal from the source 14, which could be generated totally independently of the external source of information 12 or alternatively in a manner dependent upon the information provided by the external information source 12, the memory mode selector 11 is switched, in turn switching the memory 10 from the recirculation mode to the storage mode. At this point the information provided by the external source of digital information 12 is entered into the memory 10 at a rate corresponding to the frequency of the clock 18, wherein it is stored and shifted through the memory in synchronism with the clock signals. Additionally, the trigger signal from the source 14 resets the address circuit 17 such that the output of the data in the memory 10 will be referenced to the most recently received trigger signal, that is, the trigger signal which immediately preceded entry of the data in the memory.

When the address provided by the address circuit 17 reflects storage in the memory 10 since the last trigger signal of as many elements of information as the memory 10 has elements of storage capacity, an input is provided on line 16 from the address circuit to the memory mode selector 11, which switches the memory mode from the storage mode such that further storage of information in the memory from the external source 12 is inhibited. The memory now recirculates the information stored therein as an incident to receipt of the last trigger signal. Recirculation of the stored information in the memory 10 provides a cyclicly varying input to the stored information utilization device 13. This input, in combination to the cyclicly varying input from the address circuit 17, provides a cyclicly varying display on the oscilloscope 19 of the stored information recirculating in the memory 10.

The recirculation of the stored information and the display thereof continues until a subsequent trigger signal is received from the source 14 whereupon the previously described storage and recirculation operations are repeated.

The external source of digital information 12 preferably includes a sample and hold circuit 22 having an input 23 containing analog information, such as transient electric signal produced by a strain gauge mounted on a structure undergoing impact testing. The sample and hold circuit 22 also includes an output line 24 which constitutes an input to an analog-to-digital converter 25. The sample and hold circuit 22, in response to clock signals input thereto on line 26 from the clock generator 18, provides on output line 24 samples of the analog signal input thereto on line 23, the analog signal samples being provided on line 24 at a repetition rate equal to the frequency of the clock 18. The sample and hold circuit may include a solid state electronic switch repetitively switched by the clock pulses input thereto on line 26, and a capacitive storage element which repetitively charges to the level of the analog input present on line 23 when the solid state electronic switch is repetitively switched on in response to the clock pulses. An analog-to-digital converter 25, which is responsive to the sampled analog output on line 24, provides on output line 27-0, 27-1, ... 27-9 digitized, binary-coded representations of the magnitude of the analog signal samples input thereto on line 24 from the sample and hold circuit 22. The number of output lines 27-0, 27-1, ... 27-9 is a function of the type of binary coding used to represent the digitized information and the degree to which the analog information is resolved, as is well known in the art. The digitized, binary-coded representations of the sampled analog information are produced in synchronism with the clock signals output from the clock 18, but delayed with respect thereto by an interval, e.g., 4.5 microseconds, corresponding to the time necessary for the converter 25 to perform a conversion operation.

The clock 18 which provides on its output line 26 signals for sampling the analog signal present on line 23, shifting information in memory 10, and stepping the address circuit 17, may be of any suitable construction and operate at any desired frequency. For example, the clock 18 could take the form of a crystal-controlled square wave generator having a frequency which is selectively variable between 100 milliseconds and 5 microseconds, although clock frequencies below and above this range are possible. The particular frequency to which the clock 18 is set will, for reasons well known in the art, depend upon the nature of the analog signal present on line 23 and the rate at which it is desired to sample and digitize it. For example, if the analog signal present on line 23 is of extremely short duration it will be necessary to operate the clock at a relatively high frequency to obtain a sufficient number of samples, whereas, if the analog signal present on line 23 is of relatively long duration the frequency of the clock 18 can be reduced and a sufficient number of samples still obtained.

The memory 10 includes a plurality of identical shift register cascades 30, 31, ... 39, there being as many shift register cascades 30, 31, ... 39 as there are output lines from the analog-to-digital converter 25. Since the shift register cascades 30, 31, ... 39 are identical, only shift register 30 is discussed. Shift register cascade 30 includes $nam$-bit digital shift register modules 30-1, 30-2, ... 30-$n$. The number of shift register modules 30-1, 30-2, ... 30-$n$ in the shift register cascade 30 depends upon the number of bits $m$ in each shift register 30-1, 30-2 ... 30-$n$ and the bit storage capacity $nm$ desired for the shift register cascade 30, the latter in turn depending on the nature of the analog signal present on line 23 which is being sampled and digitized for storage and ultimate reconstruction and display. In a preferred form the individual shift registers 30-1, 30-2, ... 30-$n$ of shift register cascade 30 each have a bit storage capacity $m$ of 1024 bits and the number $n$ of individual modular shift registers in the shift register cascade varies between one and 24, providing a total bit storage capacity of cascade 30 of between 1024 bits and 24,576 bits. Obviously, other bit capacities for each modular shift register could be used, depending on the needs of the user.

Associated with the shift registers, 30-1, 30-2, ... 30-$n$; 31-1, 31-2, ... 31-$n$; ... 39-1, 39-2, ... 39-$n$ of the shift register cascades 30, 31, ... 39 are variable connection means, preferably of the quick connect/disconnect type, for connecting one or more of the shift registers of each cascade in series, with the output of the last shift register of each cascade connected to the input of the first register of that cascade. The connection means include connectors 40-1, 40-2, ... 40-$n$, preferably pluggable electric cables, which interconnect the $m^{th}$ bit position of shift register 30-1 to the first bit position of shift register 30-2, the $m^{th}$ bit position of shift register 30-2 to the first bit position of shift register 30-3, ... and the $m^{th}$ bit position of the last or $n^{th}$ shift register 30-$n$ to the first bit position of the first shift register 30-1. Similar connectors 41-1, 41-2, ... 41-$n$; ... and 49-1, 49-2, ... 49-$n$ interconnect the shift registers 31-1, 31-2 ... 31$n$; ... and 39-1, 39-2, ... 39-$n$ of shift register cascades 31, ... and 39, respectively. The shift register interconnection means 40, 41, ... 49 which interconnect the shift registers 30-1, ... 30-$n$; 31-1, ... 31$n$; and 39-1, ... 39-$n$ of the cascades 30, 31, ... 39 vary depending upon the number of shift registers n in each shift register cascade. While the shift register connectors 40, 41, ... 49 interconnecting the shift registers of the cascade 30, 31, ... 39 are described as being pluggable electrical connectors, other interconnection means could be used such as diode matrices, solid state, switching networks, and the like.

Also associated with the shift register cascades 30, 31, ... 39 are two-input And gates 50, 51, ... 59 which are interconnected between outputs 27-0, 27-1, ... 27-9 from the analog-to-digital connector 25 and the input 60, 61, ... 69 associated with each shift register cascade 30, 31, ... 39. The And gates 50, 51, ... 59, in a manner to be described, selectively gate binary-coded, digitized representations of the sampled information on line 23 to the input lines 60, 61, ... 69 of the shift register cascades 30, 31, ... 39. A second series of And gates 70, 71, ... 79 are interconnected in the bit recirculation lines 40-$n$, 41-$n$, ... 49-$n$ between the last or $m^{th}$ bit position of the last or $n^{th}$ shift registers 30-$n$, 31-$n$ ... 39-$n$ and the first bit position of the first shift registers 30-1, 30-2, ... 30-9 of shift register cascades, 30, 31, ... 39. In a manner to be described hereafter, And gates 70, 71, ... 79 selectively enable the recirculation of digital information from the output to the input of the shift register cascades 30, 31, ... 39, respectively. Data recirculation And gates 70, 71, ... 79 are enabled to facilitate the recirculation of data in shift register cascades 30, 31, ... 39 when the sampled data storage And gate 50, 51, ... 59 are disabled, and vice versa, such that the shift register cascades 30, 31, ... 39 are either in their recirculation mode or their sampled data storage mode, but not simultaneously in both modes.

The modular $m$-bit shift registers 30-1, 30-2, ... 30-$n$, of shift register cascade 30, are each responsive to a delayed clock signal on line 80, the delay being introduced by a suitable delay circuit 81 connected between the clock output line 25 and the delayed clock line 80. The delayed clock signal on line 80 shifts data in the shift register cascade 30 in synchronism with, but delayed relative to, the clock pulses generated by the clock 18. The delay introduced by the delay circuit 81 is sufficient in duration to permit the analog-to-digital converter 25 to complete its conversion of a sampled analog signal on line 24 to a digital representation thereof on lines 27-0 ... 27-9 before the digitized and sampled analog signal is gated via And gate 50 into the shift register caascade 30 when the memory 10 is in the data store mode. A delay of 4.5 microseconds is adequate with analog-to-digital converters of the successive approximation type marketed by Datel Systems, Inc., designated EH-10.

The address circuit 17, which is responsive to the delayed clock pulses input on line 80 and the trigger signal on line 15, includes a single resettable $nm$-bit counter in the form of a divide-by-$n$ circuit 82 and an $m$-counter circuit 83 connected in series, which is selectively variable to provide control signals at selectively variable counts ranging between $m$ and $nm$ in increments of $m$. The divide-by-$n$ circuit 82, which may be a modulo $n$ counter, provides an output on its output line 84 to the $m$ counter 83 each time a count of $n$ delayed clock pulses is accumulated therein, whereupon the divide-by-$n$ circuit 82 resets to a count of zero. The divide-by-$n$ circuit 82 is reset to a count of zero each time the trigger source 14 provides a trigger signal on its output line 15. The divide-by-$n$ counter is adjusted, via a control shown schematically as line 85, to provide an output on line 84 every $n^{th}$ clock signal, where n is the number of modular shift registers connected in the shift register cascade. For example, if six $m$-bit shift registers are connected in each of the shift register cascades 30, 31 . . . 39, the divide-by-$n$ circuit 82 will provide on its output line 84 an output signal every sixth clock signal. That is, the divide-by-$n$ circuit 82 will provide an output on line 84 when it has accumulated a count of six, whereupon it will reset to zero and provide another output on line 84 when the count therein has again reached a count of six.

The $m$ counter 83 has a series of output lines 86-0, 86-1, . . . 86-9 which at any given time provide binary signals which collectively represent, in binary format, the current count present in the $m$ counter. The $m$ counter 83, like the divide-by-$n$ circuit 82, is reset upon the occurrence of a trigger signal from the trigger source 14 on line 15. In the preferred embodiment, where the $m$-bit shift registers of the shift register cascades 30, 31, . . . 39 each have a capacity of 1024 bits, the m counter 83 is designed to accumulate a count of 1024 whereupon it resets to zero and resumes counting from zero.

With the divide-by-$n$ circuit set to provide an output on line 84 every $n^{th}$ clock signal, where $n$ equals the number of modular $m$-bit registers in each shift register cascade 30, 31, . . . 39, and with the $m$ counter 83 designed to accumulate a count of $m$, where m equals the bit storage capacity of each modular shift register 30-1, 30-2, . . . 30-$n$ of the shift register cascade 30, and with the divide-by-$n$ circuit and the $m$ counter each reset to zero count upon occurrence of a trigger signal on line 15, the instantaneous output of the $m$ counter coincident with any given clock pulse will be correlated to the address, with reference to the last trigger signal, of the bits stored in the $m^{th}$ storage locations of the $n^{th}$ shift registers, i.e., of shift register cascades 30, 31, . . . 39. Thus, if the memory 10 is in the recirculation mode, having previously received a trigger signal and stored data from the source 12 in the memory 10, at any given instant the binary coded output of the $m$ counter 83 is correlated to the number of bits stored between the bit then present in the last or $m^{th}$ stages of the last or $n^{th}$ shift registers of shift register cascade 30, 31, . . . 39 and the first bits which were stored in the shift register cascades following the trigger signal which initiated storage of the sampled analog information which is recirculating. Since the $m$ counter 83 actually counts $1/n$ clock pulses, the binary coded output of the $m$ counter equals at any given instant the product of (a) $1/n$ and (b) the number of bits stored between the bits then present in the last stage of the last shift registers of shift register cascades 30, 31, . . . 39 and the first bits which were stored in the shift register cascades following the last trigger signal.

The address circuit 17 also includes a monostable multivibrator, or single shot, circuit 87 having its input connected to the highest order output line 86-9 of $m$-counter circuit 83. The single shot circuit 87 provides on its output line 16 a pulse when the $m$-counter has achieved a count of $m$, which is coincident with the occurrence of the $nm^{th}$ clock signal following the last trigger signal on line 15, and multiples of $nm$ clock pulses thereafter. The output on line 16, in a manner to be described, switches the memory mode selector 11 from the storage mode to the recirculate mode when the shift register cascades 30, 31, . . . 39 have been filled to capacity with digitized samples of the analog information on line 23.

The memory mode selector circuit 11 includes a bistable multivibrator, or flip-flop circuit having a "set" input responsive to trigger line 15 and a "reset" input responsive to single shot output line 16. The flip-flop 11 has complimentary set and reset outputs S and R on which are placed logical-1 and logical-0 signals in response to set and reset inputs on lines 15 and 16, respectively. The set output line 88, which is at a logical-1 signal level in response to the input to flip-flop 11 of a trigger signal on line 15, functions to enable storage And gates 50, 51, . . . 59 to gate digitized binary-coded representations of data sampled from analog line 23 into the shift register cascades 30, 31 . . . 39 of the memory 10 when a trigger signal has been received. A reset line 89 output from flip-flop 11, which is placed at a logical-0 level in response to input to flip-flop 11 of a trigger signal on line 15, functions to disable recirculate And gates 70, 71, . . . 79 to inhibit recirculation of data in the shift register cascades 30, 31, . . . 39 while data is being gated into the shift register cascades from the source 12 via enabled And gates 50, 51, . . . 59. When the flip-flop 11 is reset by the single shot output on line 16, which occurs coincident with the $nm^{th}$ clock signal following receipt of a trigger signal on line 15, the logic signal levels on lines 88 an 90 switch, that is, line 89 goes to a logic-1 level and line 88 goes to a logic-0 level. As a result, storage And gates 50, 51, . . . 59 are disabled, preventing further storage of information in the shift register cascades 30, 31, . . . 39 from the data source 12, while recirculate And gates 70, 71, . . . 79 are enabled to initiate recirculation of the data previously entered into the shift register cascades via And gates 50, 51, . . . 59.

The reset condition of flip-flop 11, which places the memory 10 in the recirculate mode, continues until receipt of the next trigger signal on line 15. Until receipt of this next trigger signal, the data stored in the shift register cascades 30, 31, . . . 39 recirculates in synchronism with the clock pulses output from the clock generator 18 on line 26. As the stored information is recirculating in memory 10, the digitized samples are cyclicly output on shift register output lines 40-$n$, 41-$n$, . . . 49-$n$. At the same time, the address circuit 17 is cyclicly reproducing on its output lines 86-0, 86-1, . . . 86-9 the addresses of the digitized samples output on lines 40-$n$, 41-$n$, . . . 49-$n$. The recirculating digitized samples on lines 40-$n$, 41-$n$, . . . 49-$n$ output from the memory cascades 30, 31, . . . 39 and their associated addresses output from the address circuit 17 on lines 86-0, 86-1, . . . 86-9 are input to the stored information utilization device 13. The stored information utilization device 13 includes the digital-to-analog converter 21 responsive to the digitized binary-coded samples recirculating in the memory 10 and the digital-to-analog converter 20 responsive to the binary-coded addresses of the information present in the $m^{th}$ stage of the $n^{th}$ shift register of shift register cascades 30, 31, . . . 39. The output of the digital-to-analog converter 21 on line 90 reresents a reconstruction, in analog form, of the analog information previously present on line 23 which was sampled, digitized and stored. The output of the digital-to-analog converter 20 on line 91 is an analog representation correlated to the address of the reconstructed analog sample present on line 90. (If the exact address of the information output from the memory 10 is desired, the binary outputs of the divide-by-$n$ counter 82 and the $m$ counter 83 could be multiplied together.) The reconstructed analog data samples on line 90 and their associated addresses, also in analog form, on line 91 are input to the oscilloscope 19 where they control the vertical and horizontal deflection plates, respectively, to provide a continuously varying X-Y plot of the information recirculating in the memory 10, with the horizontal axis representing the time axis and the vertical axis representing the magnitude of the sample information recirculating in the memory 10.

The trigger source 14 which initiates storing the output from the data source 12 in memory 10 may take a variety of forms depending on the needs of the user. For example, the trigger source 14 could be responsive to the analog information on line 23, producing a trigger signal on line 15 when the analog information reaches some predetermined threshold level. Alternatively, the trigger source 14 could be operative to produce a trigger signal on line 15 in response to momentary actuation of a push-button switch. Other forms of triggering can be used, all of which are well known in the art and form no part of this invention.

In the preferred embodiment of the invention the identical modular $m$-bit shift registers of the memory 10 are of the static type, wherein data stored therein can be shifted at any rate, as low as zero Hertz, without losing the stored data. This is in contrast to shift registers of the dynamic type which, because they operate on capacitive charge-storage principles, require that the data be shifted at some predetermined minimum rate or higher, below which if shifting occurs the data stored in the shift register is lost due to capacitive discharge effects. Suitable static shift registers are available from Signetics, designated Model 2533V. An advantage of utilizing shift registers of the static type in accordance with the preferred embodiment of this invention is that the rate at which data is sampled by the sample and hold circuit 22 can be the same as the rate at which data is shifted in the memory 10, which sample/shifting rate can be as low as desired, even zero Hertz. Such eliminates the need for sophisticated circuitry for shifting the data in the memory at a first rate exceeding some predetermined minimum shift rate, and interlacing the data being stored in the memory, which is being sampled at a second and lower rate, with the data already in the memory which is being shifted at the first and relatively higher rate. Thus, when static shift registers are used sophisticated circuitry is not required to accommodate the entry of data sampled at a relatively low rate in a memory which is being shifted at a relatively high rate.

The system of this invention, particularly the address circuit 17 which combines a divide-by-$n$ circuit and an $m$ counter to provide a resettable $nm$-bit counter selectively variable in $m$-bit increments, where $n$ represents the number of $m$-bit registers in a shift register cascade, enables the bit capacity of the memory to be varied in multiples of $m$-bits without resort to complex circuitry for generating the address information. In fact, with this invention, as the capacity of the memory 10 is altered in increments of $m$-bits, the address circuit 17 is adjusted to assure that proper addresses are generated, by merely altering the divide-by-$n$ circuit 82 such that $n$ corresponds to the number of $m$-bit shift registers then being used in each shift register cascade 30, 31, . . . 39 of the memory 10. Since this alteration can be easily accomplished using known circuit techniques, a variable length memory capability is provided with a minimum of circuit complexity.

While the invention has been described in connection with a preferred embodiment using variable length shift register cascades which store data in digital form, the invention is not limited to digital shift registers. For example, the shift register cascades could be of the bucket-brigade type which store data in analog form, in which case the analog-to-digital converters at the input and output of the shift register cascades would be unnecessary.

Having described the invention, what is claimed is:

1. A digital information storage system having a storage capacity of $c$ bits selectively variable in multiples of $m$ and $nm$ bits, where $c$, $n$ and $m$ are integers, said system comprising:

$n$ $m$-bit digital shift registers, variable connection means to interconnect one or more of said $m$-bit shift registers in cascade to produce a single shift register means having an effective bit storage capacity of $c$ bits which is selectively variable between $m$ bits and $nm$ bits in multiples of $m$ bits, a sample signal generator for producing sample signals at a predetermined sampling frequency, said sample signals being input to said single shift register means to shift bits therein at said sampling frequency, a first resettable counter means responsive to said sample signals for providing a first signal for every $c/m$ sample signals input thereto, a second resettable counter responsive to said first signals for providing a second signal for every $m$ first signals input thereto, a trigger signal generator, said trigger signal generator being connected to reset said first and second counters upon generation of a trigger signal, and shift register control means responsive to said trigger signals and said second signals for entering information into said single shift register means from an external source and recirculating information in said single shift register means, respectively, said second resettable counter also providing a series of time-spaced digital signals having a continuously changing numerical value which at any given time is correlated to the address of the data output from said single shift register means at said given time with respect to the data stored coincident with the trigger signal which effected entry of said data into said single shift register means.

2. The system of claim 1 wherein said shift registers are static shift registers and wherein the frequency of said sample signal generator is variable, including sample frequencies approaching zero Hertz.

3. A system for storing analog information in digital form having a storage capacity of $c$ bits selectively variable in multiples of $m$ bits between $m$ bits and $mn$ bits, where $c$, $n$ and $m$ are integers, said system comprising:
- $n$ $m$-bit digital shift registers,
- variable connection means to interconnect one or more of said $m$-bit shift registers in cascade to produce a single shift register means having an effective bit storage capacity of $c$ bits which is selectively variable between $m$ bits and $nm$ bits in multiples of $m$ bits,
- a sample signal generator for producing sample signals at a predetermined sampling frequency, said sample signals being input to said single shift register means to shift bits therein at said sampling frequency,
- a first resettable counter means responsive to said sample signals for providing a first signal for every $c/m$ sample signals input thereto,
- a second resettable counter responsive to said first signals for providing a second signal for every $m$ first signals input thereto,
- a trigger signal generator, said trigger signal generator being connected to reset said first and second counters upon generation of a trigger signal,
- an analog to digital connecter for converter analog signals input thereto from an external source into digital output signals,
- a shift register control means responsive to said trigger signals and said second signals for entering information into said single shift register means from said external source and recirculating information in said single shift register means, respectively, and
- a digital to analog converter for converting into analog signals digital signals input thereto from the output of said single shift register means.

4. The system of claim 3 wherein said shift registers are static shift registers and wherein the frequency of said sample signal generator is variable, including sample frequencies approaching zero Hertz.

5. A method of storing digital data which varies in bit length $c$ between $m$ bits and $nm$ bits, where $c$, $m$ and $n$ are integers, the variation being in multiples of $m$ bits, the method comprising:
- connecting in cascade $c/m$ m-bit shift registers to form a single shift register means having a bit capacity $c$,
- generating sample signals at a predetermined sampling frequency,
- shifting information in said single shift register means in response to said sample signals,
- counting said sample signals in a first counter and generating a first output signal for every $c/m$ sample signals input to said first counter,
- counting said first output signals in a second counter and generating a second output signal for every $m$ first signals input to said second counter,
- generating a trigger signal,
- counting said first output signals in said second counter and generating a series of time-spaced digital signals having a continuously changing numerical value which at any given time is correlated to the address of the data output from said single shift register means at said given time relative to the data stored coincident with the trigger signal which effected entry of said data into said single shift register means,
- resetting said first and second counters in response to said trigger signal,
- entering digital data into said single shift register means from an external source in response to said trigger signal, and
- recirculating data in said single shift register means in response to said second output signal.

6. An information storage system having $c$ storage elements variable in multiples of $m$ storage elements between $m$ storage elements and $nm$ storage elements, where $c$, $n$ and $m$ are integers, comprising:
- $n$ shift registers each having $m$ storage elements, each storage element storing an information sample,
- variable connection means to interconnect one or more of said shift registers in cascade to produce a single shift register means having an effective capacity of $c$ information samples which is selectively variable between $m$ information samples and $nm$ information samples in multiples of $m$ samples,
- a sample signal generator for producing sample signals at a predetermined sampling frequency, said sample signals being input to said single shift register means to shift samples therein at said sampling frequency,
- a first resettable counter means responsive to said sample signals for providing a first signal for every $c/m$ sample signals input thereto,
- a second resettable counter responsive to said first signals for providing a second signal for every $m$ first signals input thereto,
- a trigger signal generator, said trigger signal generator being connected to reset said first and second counters upon generation of a trigger signal, and
- shift register control means responsive to said trigger signals and said second signals for entering information into said single shift register means from an external source and recirculating information in said single shift register means, respectively,
- said second resettable counter also providing a series of time-spaced digital signals having a continuously changing numerical value which at any given time is correlated to the address of the data output from said single shift register means at said given time with respect to the data stored coincident with the trigger signal which effected entry of said data into said single shift register means.

7. An information storage system having $c$ storage elements variable in multiples of $m$ storage elements between $m$ storage elements and $nm$ storage elements, where $c$, $n$ and $m$ are integers, comprising:
- $n$ shift registers each having $m$ storage elements, each storage element storing an information sample,
- variable connection means to interconnect one or more of said shift registers in cascade to produce a single shift register means having an effective capacity of $c$ information samples which is selectively variable between $m$ information samples and $nm$ information samples in multiples of $m$ samples,
- a sample signal generator for producing sample signals at a predetermined sampling frequency, said sample signals being input to said single shift register means to shift samples therein at said sampling frequency,
- resettable variable count counter means responsive to said sample signal generator for producing a control signal every $nm^{th}$ signal input thereto, said counter means including means to selectively vary the operation thereof to provide control signals at selectively variable counts ranging between $m$ and $mn$ in increments of $m$, a trigger signal generator, said trigger signal generator being connected to reset said counter means upon generation of a trigger signal, and shift register control means responsive to said trigger signal and said control signals for entering information into said single shift register means from an external source and recirculating information in said single shift register means, respectively, said resettable counter means also providing a series of time-spaced digital signals having a continuously changing numerical value which at any given time is correlated to the address of the data output from said single shift register means at said given time with respect to the data stored coincident with the trigger signal which effected entry of said data into said single shift register.

8. An information storage and reproduction system having $c$ storage elements capable of storing information samples and reproducing information samples at sample frequencies approaching zero Hertz, comprising:

a static shift register having $c$ storage elements, each storage element storing an information sample, said shift register capable of shifting information at a shift rate approaching zero Hertz, a sample signal generator for producing sample signals at a predetermined sampling frequencey capable of approaching zero Hertz, said sample signals being input to said static shift register to shift samples therein at said sampling frequency, resettable counter means to produce a control signal every $c^{th}$ sample, a trigger signal generator, said trigger signal generator being connected to reset said counter means upon generation of a trigger signal, and shift register control means responsive to said trigger signal and said control signals for entering information into said shift register from an external source and recirculating information in said shift register, respectively, said resettable counter means also providing a series of time-spaced digital signals, having a continuously changing numerical value which at any given time is correlated to the address of the data output from said static shift register at said given time with respect to the data stored coincident with the trigger signal which effected entry of said data into said static shift register.

9. The system of claim 3 wherein said second resettable counter also provides a series of time-spaced digital signals having a continuously changing numerical value which at any given time is correlated to the address of the data output from said single shift register means at said given time with respect to the data stored coincident with the trigger signal which effected entry of said data into said single shift register means.

10. The system of claim 4 wherein said second resettable counter also provides a series of time-spaced digital signals having a continuously changing numerical value which at any given time is correlated to the address of the data output from said single shift register means at said given time with respect to the data stored coincident with the trigger signal which effected entry of said data into said single shift register means.

11. The system of claim 1 wherein said digital information is initially in analog form supplied from an external source, said system further including:

an analog-to-digital converter for converting analog signals input thereto from an external source into digital signals for input to said single shift register means under control of said shift register control means, a digital-to-analog converter for converting into analog signals digital signals input thereto from the output of said single shift register means, and utilization means responsive to both the output of said digital-to-analog converter and said series of time-spaced digital signals for reproducing in analog form as a function of time said information initially input into said single shift register means from said external source.

12. The system of claim 7 wherein said digital information is initially in analog form supplied from an external source, said system further including:

an analog-to-digital converter for converting analog signals input thereto from an external source into digital signals for input to said single shift register means under control of said shift register control means, a digital-to-analog converter for converting into analog signals digital signals input thereto from the output of said single shift register means, and utilization means responsive to both the output of said digital-to-analog converter and said series of time-spaced digital signals for reproducing in analog form as a function of time said information initially input into said single shift register means from said external source.

13. The system of claim 9 wherein said digital information is initially in analog form supplied from an external source, said system further including:

an analog-to-digital converter for converting analog signals input thereto from an external source into digital signals for input to said static shift register under control of said shift register control means, a digital-to-analog converter for converting into analog signals digital signals input thereto from the output of said static shift register, and utilization means responsive to both the output of said digital-to-analog converter and said series of time-spaced digital signals for reproducing in analog form as a function of time said information initially input into said static shift register from said external source.

14. The method of claim 5 further including the steps of:

converting analog signals input from an external source into digital signals for input to said single shift register means under control of said sample signals, converting into analog signals digital signals input from the output of said single shift register means, and reproducing in analog form as a function of time said information initially input into said single shift register means from said external source.

15. The system of claim 6 wherein said digital information is initially in analog form supplied from an external source, said system further including:

an analog-to-digital converter for converting analog signals input thereto from an external source into digital signals for input to said single shift register means under control of said shift register control means, a digital-to-analog converter for converting into analog signals digital signals input thereto from the output of said single shift register means, and utilization means responsive to both the output of said digital-to-analog converter and said series of time-spaced digital signals for reproducing in analog form as a function of time said information initially input into said single shift register means from said external source.

* * * * *

UNITED STATES PATENT AND TRADEMARK OFFICE
CERTIFICATE OF CORRECTION

PATENT NO. : 3,972,031
DATED : July 27, 1976
INVENTOR(S) : Don H. Riemenschneider et al It is certified that error appears in the above-identified patent and that said Letters Patent are hereby corrected as shown below:

Column 5, line 43: "nam-bit" should be --n m-bit--.

Column 5, line 68: insert the word "shift" between the words "first" and "register".

Column 6, line 64: "caascade" should be --cascade--.

Column 8, line 42: "90" should be --89--.

Column 13, line 21: insert the word "means" after the word "register" at the end of the line.

Signed and Sealed this

Sixteenth Day of November 1976

[SEAL]

Attest:

RUTH C. MASON
Attesting Officer

C. MARSHALL DANN
Commissioner of Patents and Trademarks